US008952919B2

(12) United States Patent
Yi et al.

(10) Patent No.: US 8,952,919 B2
(45) Date of Patent: Feb. 10, 2015

(54) CAPACITIVE TOUCH SENSITIVE HOUSING AND METHOD FOR MAKING THE SAME

(71) Applicant: Taiwan Green Point Enterprises Co., Ltd., Taichung (TW)

(72) Inventors: Sheng-Hung Yi, Taichung (TW); Pen-Yi Liao, Taichung (TW)

(73) Assignee: Taiwan Green Point Enterprises Co., Ltd., Taichung (TW)

( * ) Notice: Subject to any disclaimer, the term of this patent is extended or adjusted under 35 U.S.C. 154(b) by 0 days.

(21) Appl. No.: 14/196,107

(22) Filed: Mar. 4, 2014

(65) Prior Publication Data

US 2014/0183020 A1     Jul. 3, 2014

Related U.S. Application Data

(63) Continuation-in-part of application No. 13/285,219, filed on Oct. 31, 2011, now Pat. No. 8,692,790, which is a continuation-in-part of application No. 13/035,531, filed on Feb. 25, 2011, now Pat. No. 8,621,749.

(51) Int. Cl.
*G06F 3/041*      (2006.01)
*H03K 17/96*     (2006.01)
*G06F 3/044*      (2006.01)
*G06F 3/0354*    (2013.01)

(52) U.S. Cl.
CPC ............ *H03K 17/9622* (2013.01); *G06F 3/044* (2013.01); *G06F 3/03547* (2013.01); *G06F 2203/0339* (2013.01); *H03K 2217/960755* (2013.01)
USPC ............................................ 345/173; 29/846

(58) Field of Classification Search
USPC ...................... 345/173–174; 29/846
See application file for complete search history.

(56) References Cited

U.S. PATENT DOCUMENTS

| 8,692,790 | B2* | 4/2014 | Yi et al. ......................... 345/173 |
| 2003/0214486 | A1* | 11/2003 | Roberts ......................... 345/173 |
| 2010/0026656 | A1* | 2/2010 | Hotelling et al. ............. 345/174 |

* cited by examiner

*Primary Examiner* — Jeremy C Norris
(74) *Attorney, Agent, or Firm* — Hamre, Schumann, Mueller & Larson, P.C.

(57) ABSTRACT

A method for making a capacitive touch sensitive housing, comprises: forming a non-patterned active metal layer on a housing wall; patterning the non-patterned active metal layer on the housing wall by laser ablation such that the non-patterned active metal layer is formed into a patterned active metal layer including a plurality of plating portions separated from each other, and a plurality of non-plating portions separated from the plating portions; and forming a metal layer on the patterned active metal layer such that the metal layer has first portions formed on the plating portions of the patterned active metal layer, and second portions formed on the non-plating portions of the patterned active metal layer.

20 Claims, 7 Drawing Sheets

CAPACITIVE TOUCH SENSITIVE HOUSING AND METHOD FOR MAKING THE SAME

CROSS-REFERENCE TO RELATED APPLICATION

This application is a continuation-in-part application of U.S. patent application Ser. No. 13/285,219 filed on Oct. 31, 2011, which is a continuation-in-part application of U.S. patent application Ser. No. 13/035,531 filed on Feb. 25, 2011.

BACKGROUND OF THE INVENTION

1. Field of the Invention

The invention relates to a touch sensitive housing, and more particularly to a method of making a touch sensitive housing formed with touch sensor pads, each containing an active metal layer and a metal layer formed on the active metal layer.

2. Description of the Related Art

U.S. Pat. No. 7,656,393 discloses a touch sensitive housing or bezel that includes a housing wall and a touch sensitive surface integrated into the housing wall. The touch sensitive surface has a capacitive sensor array and a data acquisition circuitry having a configuration similar to those disclosed in U.S. patent application Ser. No. 10/949,060. Conventionally, such capacitive sensor array is formed by forming a metal layer on a substrate through metallization or metal deposition, followed by patterning the metal layer through photolithographic and etching techniques. However, it is relatively difficult to form circuits on a curved and bent wall surface.

Electroless plating of metal to form circuit patterns on insulating substrates, such as formation of conductive lines on a circuit board, has been known in the art. U.S. Pat. No. 4,898,648 discloses a conventional method of forming a circuit pattern on an insulating substrate involves the steps of forming an active metal layer on an insulating substrate, laser patterning the active metal layer to form a pattern of active metal lines, followed by electroless plating of conductive metal lines on the active metal lines of the patterned active metal layer. However, the circuit pattern thus formed has a relatively low adherence to the insulating substrate. U.S. Pat. No. 4,898,648 also discloses an improved method of making a circuit pattern on a circuit board. FIGS. 1A to 1D illustrate consecutive steps of the improved method. The method includes forming an active metal layer 92 on a circuit board 91, electroless depositing a deposited metal layer 93 on the active metal layer 92, laser patterning the deposited metal layer 93 and the active metal layer 92 to form the deposited metal layer 93 into metal lines 931 and the active metal layer 92 into metal lines 921, and electroplating a plated metal layer 94 on the metal lines 931, thereby forming the circuit pattern on the circuit board 91.

The aforementioned method is disadvantageous in that since the ablated portions of the deposited metal layer 93 and the active metal layer 92 removed by the laser ablation has a relatively large area comparing to those of the metal lines 931 or the metal lines 921, the method is time consuming and has a high power consumption and a tendency of massively damaging the insulating substrate.

SUMMARY OF THE INVENTION

Therefore, the object of the present invention is to provide a method of making a capacitive touch sensitive housing that can overcome the aforesaid drawback(s) associated with the prior art.

According to one aspect of the present invention, there is provided a method for making a capacitive touch sensitive housing. The method comprises: forming a non-patterned active metal layer on a housing wall; patterning the non-patterned active metal layer on the housing wall by laser ablation such that the non-patterned active metal layer is formed into a patterned active metal layer which includes a plurality of plating portions physically separated from each other, and a plurality of non-plating portions physically separated from the plating portions; and forming a metal layer on the patterned active metal layer such that the metal layer has first portions formed on the plating portions of the patterned active metal layer, and second portions formed on the non-plating portions of the patterned active metal layer.

According to another aspect of the present invention, a capacitive touch sensitive housing, comprises: a housing wall having an insulative surface; at least one array of capacitive touch sensor pads formed on the insulative surface of the housing wall for providing touch input functions to an electronic device; a plurality of conductive bonding pads formed on the insulative surface of the housing wall and adapted to be electrically coupled to a circuit board of the electronic device; and a plurality of conductive lines formed on the insulative surface of the housing wall, each of the conductive lines extending from a respective one of the touch sensor pads to a respective one of the bonding pads and cooperating with the respective one of the capacitive touch sensor pads and the respective one of the bonding pads to define a touch sensor unit; wherein the touch sensor unit has a layered structure including an active metal layer and a metal layer that is formed on the active metal layer, the active metal layer being made from an active material containing an active metal that is capable of catalytically initiating the forming of the metal layer.

According to still another aspect of the present invention, a method for making a capacitive touch sensitive housing, comprises: forming a non-patterned active metal layer on a housing wall; forming a metal layer on the non-patterned active metal layer; and patterning the metal layer and the non-patterned active metal layer such that the non-patterned active metal layer is formed into a patterned active metal layer which includes a plurality of plating portions physically separated from each other and a plurality of non-plating portions physically separated from the plating portions, and the metal layer has first portions formed on the plating portions of the patterned active metal layer and second portions formed on the non-plating portions of the patterned active metal layer.

According to still another aspect of the present invention, a method for making a capacitive touch sensitive housing, comprises: forming a patterned active metal layer on a housing wall such that the patterned active metal layer includes a plurality of plating portions physically separated from each other; and forming a metal layer on the patterned active metal layer such that the metal layer has s first portions formed on the plating portions of the patterned active metal layer.

BRIEF DESCRIPTION OF THE DRAWINGS

In drawings which illustrate an embodiment of the invention.

DETAILED DESCRIPTION OF THE PREFERRED EMBODIMENT

FIGS. 2 to 5 illustrate an electronic device 100, such as a mobile phone, including the preferred embodiment of a capacitive touch sensitive housing according to the present invention. The electronic device 100 further includes a circuit board 7 and a flexible flat cable 8 connected to the circuit board 7.

The capacitive touch sensitive housing includes a housing wall 2 having an insulative surface, and a circuit pattern formed on the insulative surface of the housing wall 2. The circuit pattern includes: two arrays 10 of capacitive touch sensor pads 3 formed on the insulative surface of the housing wall 2 for providing touch input functions, such as scrolling, page up and down, volume adjustment, zoom in and zoom out, etc., to the electronic device 100; a plurality of conductive bonding pads 5 formed on the insulative surface of the housing wall 2 and adapted to be electrically coupled to the circuit board 7 through the flexible flat cable 8; and a plurality of conductive lines 4 formed on the insulative surface of the housing wall 2. Each of the conductive lines 4 extends from a respective one of the touch sensor pads 3 to a respective one of the bonding pads 5 and cooperates with the respective one of the capacitive touch sensor pads 3 and the respective one of the bonding pads 5 to define a touch sensor unit 6.

Figure 4:
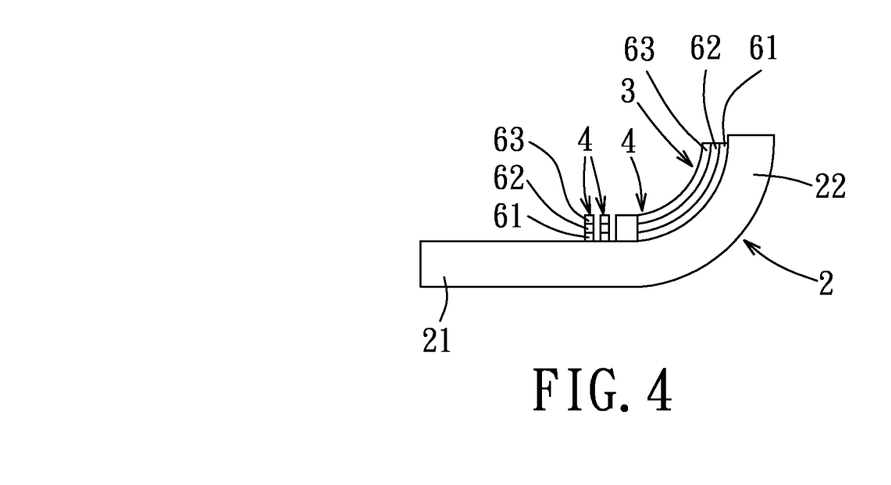
FIG. 4 is a fragmentary sectional view of the preferred embodiment taken along lines IV-IV in FIG. 3.
Figure 5:
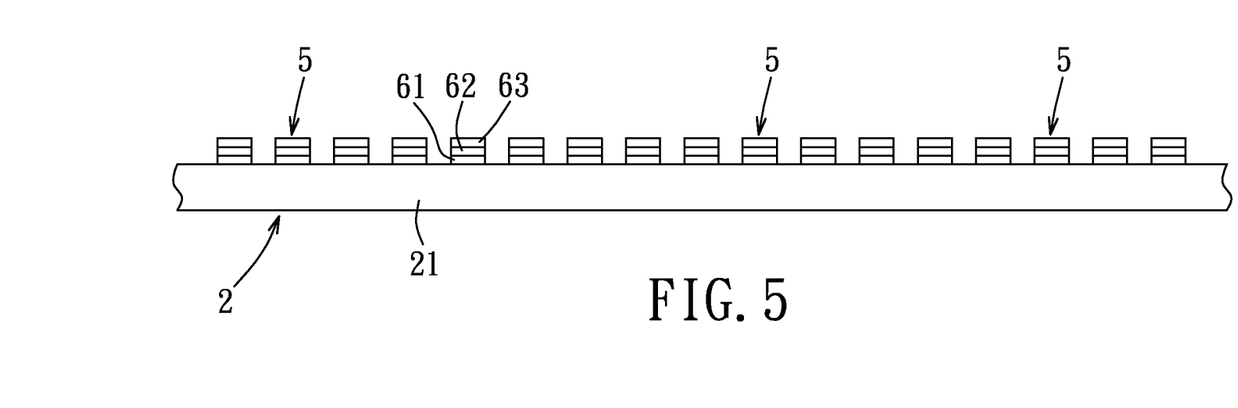
FIG. 5 is a fragmentary sectional view of the preferred embodiment taken along lines V-V in FIG. 3.

The touch sensor unit 6 has a layered structure including an active metal layer 61, a metal layer 62 that is formed on the active metal layer 61, and a plated metal layer 63 that is formed on the metal layer 62.

In operation, when a user's finger touches or approaches the housing wall 2 at a position close to one or more adjacent ones of the capacitive touch sensor pads 3, the user's finger can be capacitively coupled to said one or adjacent ones of the capacitive touch sensor pads 3, which causes change in capacitance between said one or adjacent ones of the capacitive touch sensor pads 3. The capacitance change can be detected by an IC controller (not shown) for performing a corresponding touch function.

The active metal layer 61 is made from an active material containing an active metal that is capable of catalytically initiating electroless deposition and that is selected from the group consisting of palladium, rhodium, platinum, iridium, osmium, gold, nickel, iron, and combinations thereof.

Figure 1A:
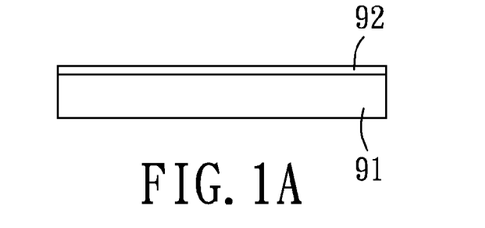
FIGS. 1A to 1D are schematic views illustrating consecutive steps of a conventional method of making metal lines on a circuit board.
Figure 1B:
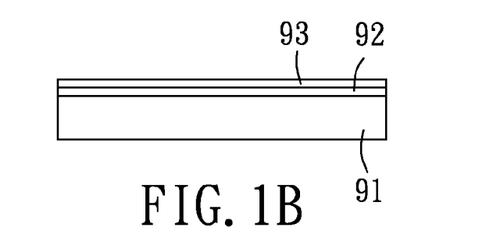
Figure 1C:
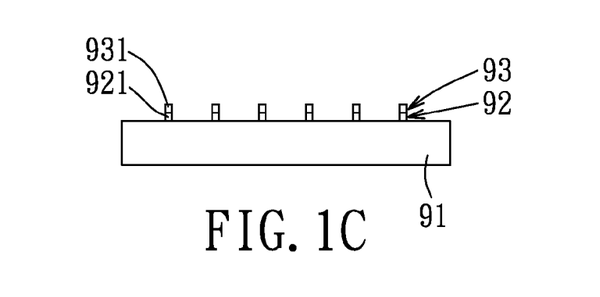
Figure 1D:
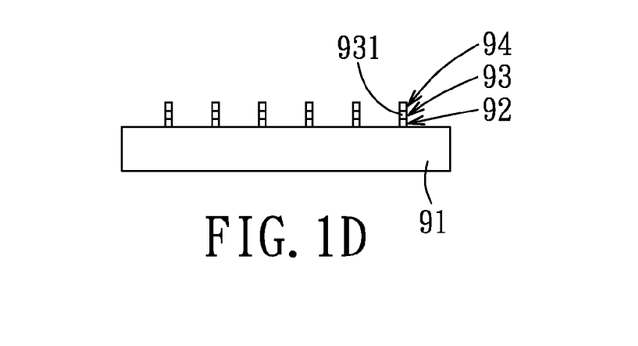
Figure 2:
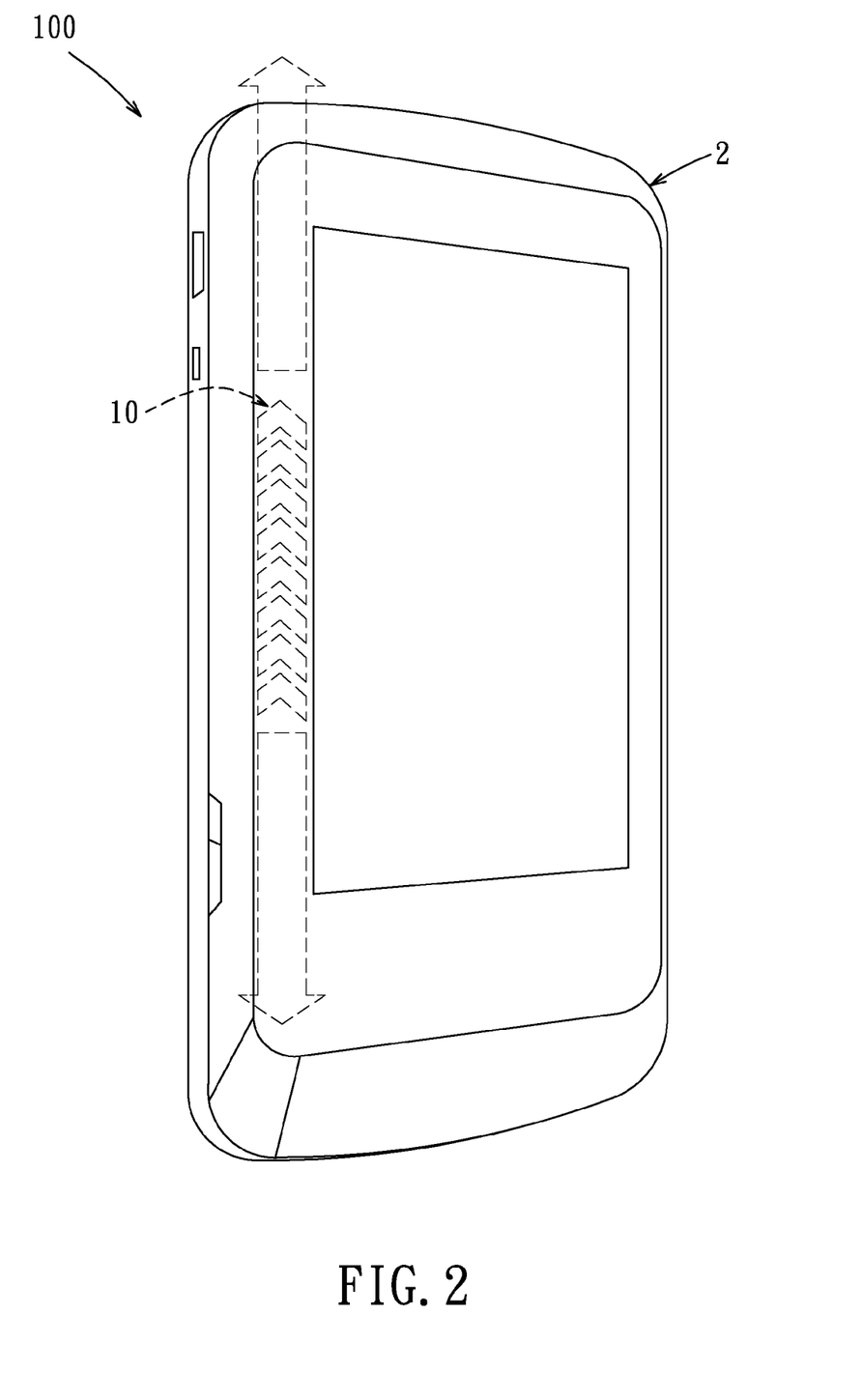
FIG. 2 is a perspective view of an electronic device including the preferred embodiment of a capacitive touch sensitive housing according to the present invention.
Figure 3:
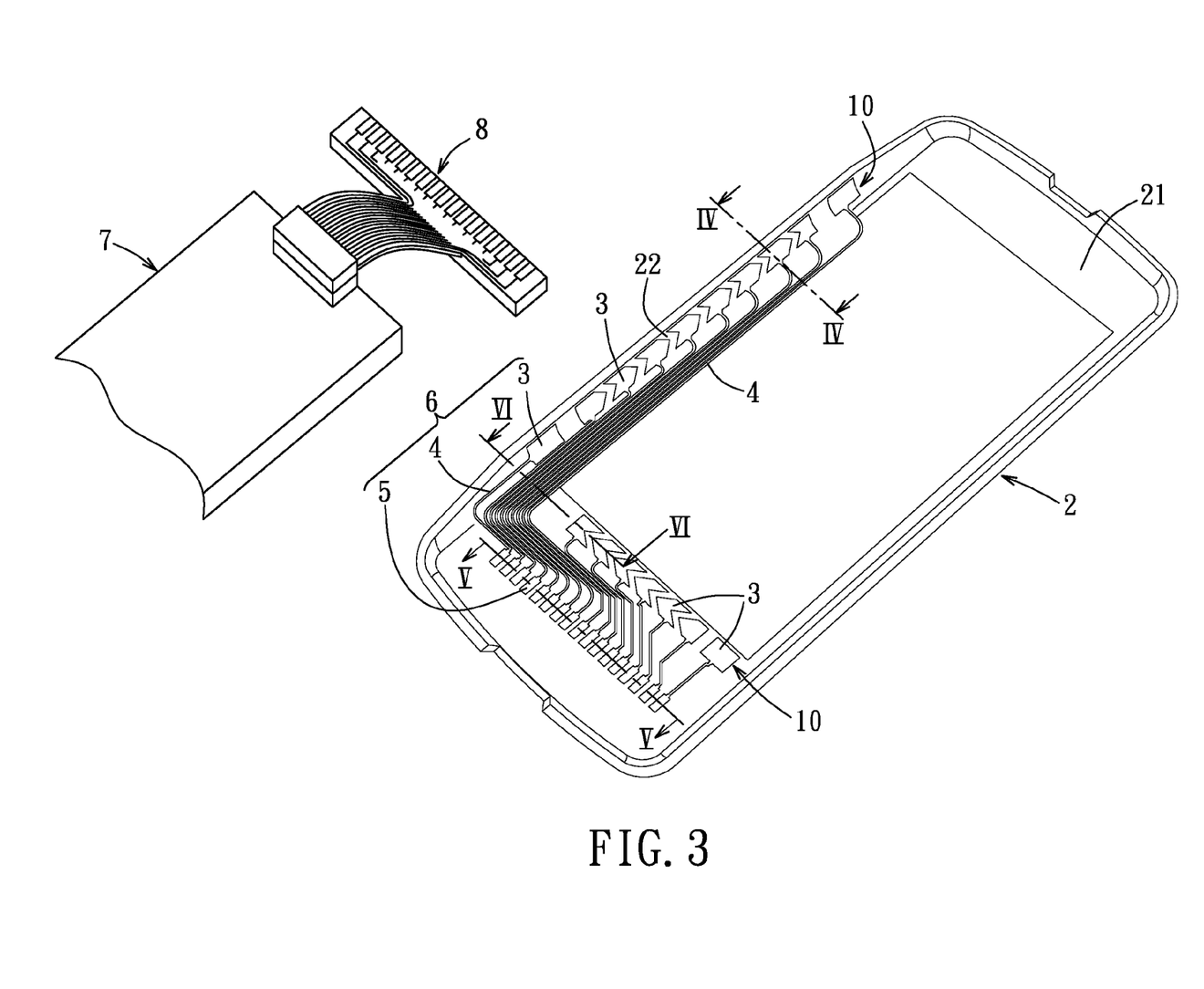
FIG. 3 is a perspective view of the preferred embodiment.

In this embodiment, the housing wall 2 is a cover of the electronic device 100, and includes a base wall portion 21 and a peripheral wall portion 22. The base wall portion 21 has a peripheral edge 211. The peripheral wall portion 22 extends from the peripheral edge 211 in such a manner that the peripheral wall portion 22 and the base wall portion 21 cooperatively form a structure having a generally U-shaped cross-section. One of the two arrays 10 of the capacitive touch sensor pads 3 is formed on the peripheral wall portion 22, and the other array 10 of the capacitive touch sensor pads 3 is formed on the base wall portion 21. The bonding pads 5 are formed on the base wall portion 21. The peripheral wall portion 22 is curved in shape, and each of the capacitive touch sensor pads 3 has a curved shape similar to that of the peripheral wall portion 22.

Preferably, the metal layer is made from a metal selected from the group consisting of copper, gold, silver, and nickel.

Preferably, the plated metal layer is made from a metal selected from the group consisting of Ni, copper, gold, and silver.

Preferably, the housing wall 2 is made from an insulative material selected from polycarbonate, glass, ceramic, wood and fabrics.

FIGS. 6A to 6E illustrate consecutive steps of the preferred embodiment of a method of making the capacitive touch sensitive housing according to the present invention. The method utilizes a non-deleterious technique for creating continuous conductive circuits upon surfaces of a non-conductive substrate as disclosed in Applicant's pending Patent Application No. 13/035531 from which the priority is being claimed as set forth above.

The method of making the capacitive touch sensitive housing according to the present invention includes the steps of: forming a non-patterned active metal layer 64 on the housing wall 2 (see FIG. 6A); patterning the non-patterned active metal layer 64 on the housing wall 2 by laser ablation such that the non-patterned active metal layer 64 is formed into a patterned active metal layer 65 which includes a plurality of plating portions 651 physically separated from each other, and a plurality of non-plating portions 652 physically separated from the plating portions 651 (see FIG. 6B), the plating portions 651 having a pattern corresponding to the circuit pattern to be formed on the housing wall 2; forming a metal layer 66 on the patterned active metal layer 65 such that the metal layer 66 has first portions 661 formed on the plating portions 651 of the patterned active metal layer 65, and second portions 662 formed on the non-plating portions 652 of the patterned active metal layer 65 (see FIG. 6C); electroplating a plated metal layer 67 on the first portions 661 of the metal layer 66 (see FIG. 6D) by coupling the first portions 661 to a power source (not shown); and subsequently removing the second portions 662 of the metal layer 66 and the non-plating portions 652 of the patterned active metal layer 65 from the housing wall 2 (see FIG. 6E), thereby forming the circuit pattern. The plating portions 651 of the patterned active metal layer 65, the first portions 661 of the metal layer 66 and the plated metal layer 67 cooperatively define the layered structure of the touch sensor unit 6.

Figure 6A:
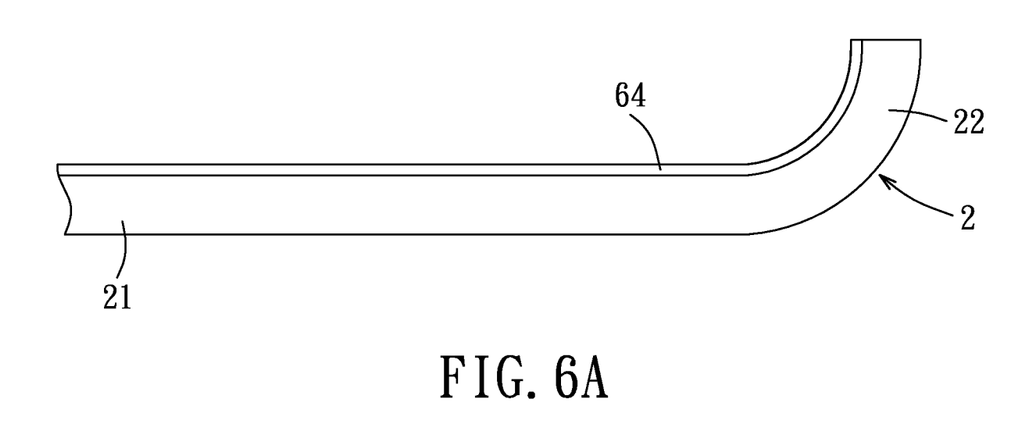
FIGS. 6A to 6E are fragmentary sectional views taken from lines VI-VI in FIG. 3 to illustrate consecutive steps of the preferred embodiment of a method of making the capacitive touch sensitive housing according to the present invention.
Figure 6B:
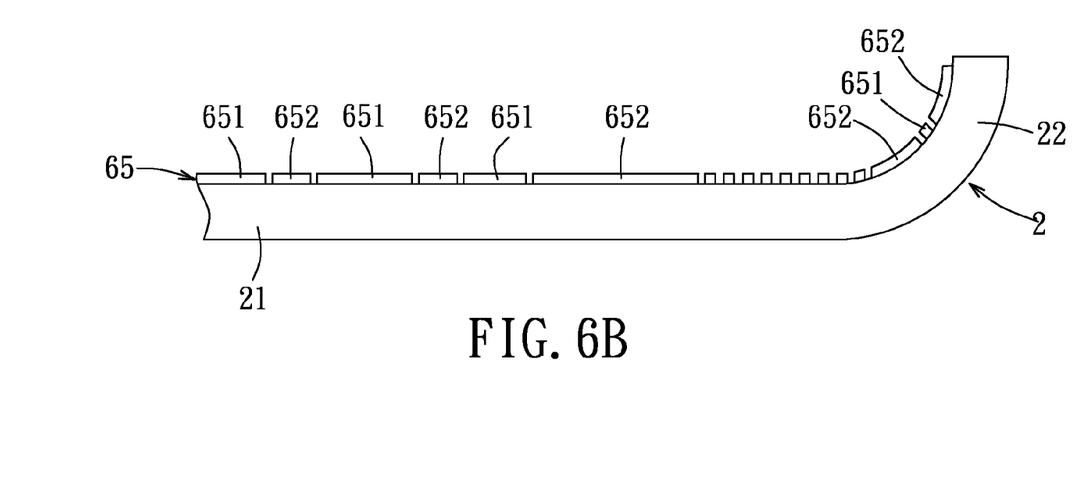
Figure 6C:
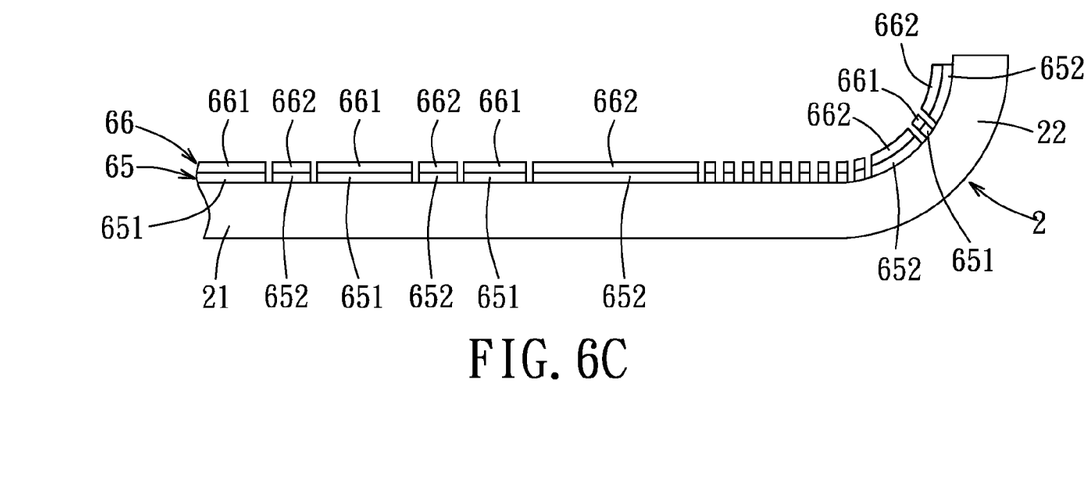
Figure 6D:
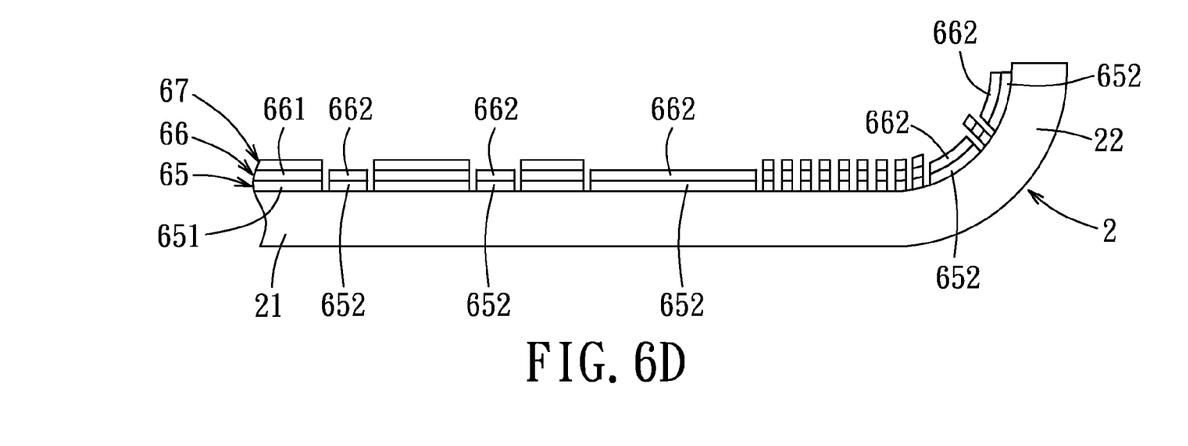
Figure 6E:
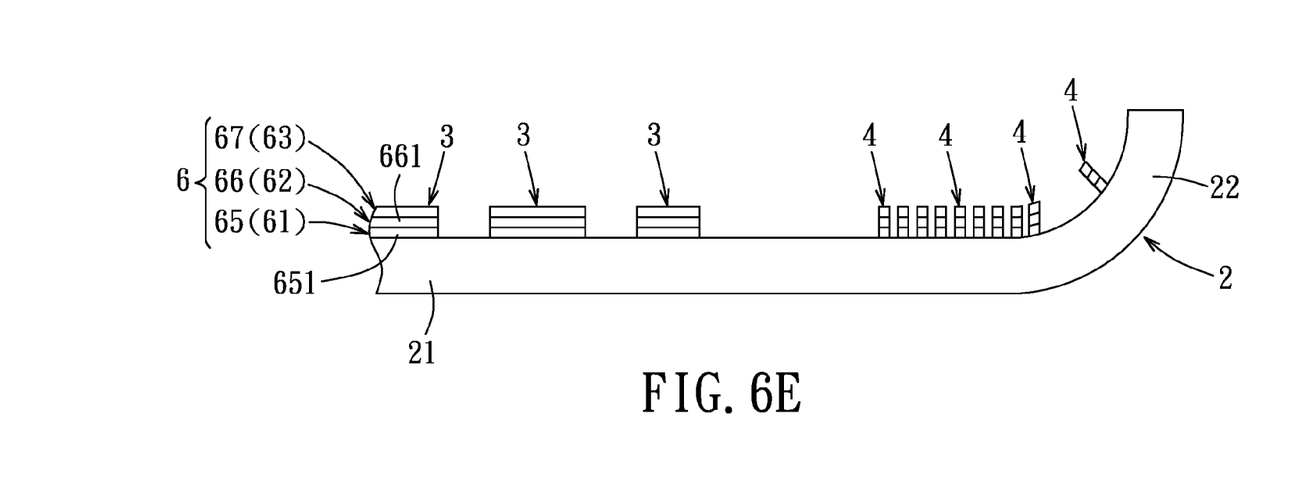

In another embodiment, the step of patterning by laser ablation can be performed after forming the metal layer 66 on the non-patterned active metal layer 64, such that the metal layer 66 has the first portions 661 and the second portions 662 physically separated from the first portions 661, meanwhile, the non-patterned active metal layer 64 is formed into the patterned active metal layer 65 which includes the plating portions 651 beneath the first portions 661 and the non-plating portions 652 beneath the second portions 662 (see FIG. 6C).

The forming of the metal layer (66) may be performed by electroless depositing or printing. The electroless deposition may be a wet chemical plating.

The printing may be screen printing, transfer printing or jet printing. Preferably, screen printing is utilized to form conductive ink containing metal particles on the patterned active metal layer 65 to form the metal layer 66.

Preferably, formation of the non-patterned active metal layer 64 on the housing wall 2 is performed by immersing the housing wall 2 into an aqueous active metal solution, such as a palladium-tin colloid solution, followed by removing the housing wall 2 from the active metal solution bath, washing with a diluted sulfuric acid liquid, rinsing and drying. Since the processes of forming an active metal layer on a medium using an active metal solution bath for subsequent electroless deposition has been well known in the art, such as U.S. Pat. Nos. 4,898,648, 5,086,966, and 6,325,910, the same will not be described in further detail herein for the sake of brevity. In another embodiment, formation of the non-patterned active metal layer 64 is performed by printing, such as screen printing, transfer printing and jet printing.

In another embodiment, screen printing is utilized to dispense conductive ink containing active metal particles on the housing wall 2 according to a predefined pattern, to form the patterned active metal layer 65 which just includes a plurality of plating portions 651 physically separated from each other, for subsequent electroless deposition. That is, the step of patterning the non-patterned active metal layer 64 by laser ablation can be omitted in the embodiment.

The laser ablation of the non-patterned active metal layer 64 is performed using an yttrium aluminum garnet (YAG) laser source under laser parameters including 4 to 10 W of the laser power, 5 to 30 K of the frequency, and 1 to 7% of the power density. Since laser ablation techniques has been known in the art for patterning a metal layer, the mechanism and operation conditions thereof can be further referred to Applicant's pending patent application Ser. No. 13/035531 and/or U.S. Pat. No. 4,898,648 and will not be described in further detail herein for the sake of brevity.

When a copper chemical plating solution is used for forming the metal layer 66 on the patterned active metal layer 65, the electroless depositing is preferably performed under a temperature ranging from 50 to 55 and a processing time ranging from 2 to 5 minutes, and when a nickel chemical plating solution is used, the electroless depositing is preferably performed under a temperature ranging from 40 to 45 and a processing time ranging from 2 to 5 minutes.

When a nickel plating solution is used for forming the plated metal layer 67 on the first portions 661 of the metal layer 66, the electroplating is preferably performed under a temperature ranging from 50 to 55 and a processing time ranging from 2 to 5 minutes, and when a copper plating solution is used, the electroplating is preferably performed under a temperature ranging from 50 to 55 and a processing time ranging from 15 to 25 minutes.

Preferably, removal of the second portions 662 of the metal layer 66 and the non-plating portions 652 of the patterned active metal layer 65 from the housing wall 2 is performed by chemical washing.

It is important to note that the first portions 661 and the second portions 662 of the metal layer 66 are formed on the plating portions 651 and the non-plating portions 652 of the patterned active metal layer 65, respectively. While the first portions 661 of the metal layer 66, in essence, are only needed on the housing wall 2, formation of the first portions 661 and the second portions 662 on the plating portions 651 and the non-plating portions 652 can be more cost-effective and time-saving than processing the housing wall 2 to inhibit formation of the second portions 662 on the non-plating portions 652. That is, forming the entirety of the patterned active metal layer 65 with the metal layer 66 and later removing the second portions 662 of the metal layer 66 and the non-plating portions 652 of the patterned active metal layer 65 from the housing wall 2 can be easier and more efficient than attempting to limit formation of the first portions 661 of the metal layer 66 on the plating portions 651 of the patterned active metal layer 65.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A capacitive touch sensitive housing, comprising:
    a housing wall having an insulative surface;
    at least one array of capacitive touch sensor pads formed on said insulative surface of said housing wall for providing touch input functions to an electronic device;
    a plurality of conductive bonding pads formed on said insulative surface of said housing wall and adapted to be electrically coupled to a circuit board of the electronic device; and
    a plurality of conductive lines formed on said insulative surface of said housing wall, each of said conductive lines extending from a respective one of said touch sensor pads to a respective one of said bonding pads and cooperating with the respective one of said capacitive touch sensor pads and the respective one of said bonding pads to define a touch sensor unit;
    wherein said touch sensor unit has a layered structure including an active metal layer and a metal layer that is formed on said active metal layer, said active metal layer being made from an active material containing an active metal that is capable of catalytically initiating the forming of said metal layer.

2. The capacitive touch sensitive housing of claim 1, wherein said active metal is selected from the group consisting of palladium, rhodium, platinum, iridium, osmium, gold, nickel, iron, and combinations thereof.

3. The capacitive touch sensitive housing of claim 1, wherein said housing wall includes a base wall portion and a peripheral wall portion, said base wall portion having a peripheral edge, said peripheral wall portion extending from said peripheral edge in such a manner that said peripheral wall portion and said base wall portion cooperatively form a structure having a generally U-shaped cross-section, said capacitive touch sensor pads being formed on said peripheral wall portion.

4. The capacitive touch sensitive housing of claim 3, wherein said peripheral wall portion is curved in shape, and each of said capacitive touch sensor pads has a curved shape similar to that of said peripheral wall portion.

5. The capacitive touch sensitive housing of claim. 3, wherein said bonding pads are formed on said base wall portion.

6. The capacitive touch sensitive housing of claim 1, wherein said metal layer is made from a metal selected from the group consisting of copper, gold, silver, and nickel.

7. The capacitive touch sensitive housing of claim 1, wherein said layered structure further has a plated metal layer formed on said metal layer, said plated metal layer being made from a metal selected from the group consisting of Ni, copper, gold and silver.

8. The capacitive touch sensitive housing of claim 1, wherein said housing wall is made from an insulative material selected from polycarbonate, glass, ceramic, wood and fabrics.

9. The capacitive touch sensitive housing of claim 1, wherein the forming of the metal layer is performed by printing.

10. A method for making a capacitive touch sensitive housing, comprising:

forming a non-patterned active metal layer on a housing wall;

patterning the non-patterned active metal layer on the housing wall such that the non-patterned active metal layer is formed into a patterned active metal layer which includes a plurality of plating portions physically separated from each other, and a plurality of non-plating portions physically separated from the plating portions; and forming a metal layer on the patterned active metal layer such that the metal layer has s first portions formed on the plating portions of the patterned active metal layer, and second portions formed on the non-plating portions of the patterned active metal layer.

11. The method of claim 10, further comprising removing the second portions of the metal layer and the non-plating portions of the patterned active metal layer from the housing wall.

12. The method of claim 11, further comprising electroplating a plated metal layer on the first portion s of the metal layer before the step of removing the second portions of the metal layer and the non-plating portions of the patterned active metal layer from the housing wall.

13. The method of claim 11, wherein removal of the second portions of the metal layer and the non-plating portions of the patterned active metal layer from the housing wall is performed by chemical washing.

14. The method of claim 10, wherein the housing wall include s a base wall portion and a peripheral wall portion, the base wall portion having a peripheral edge, the peripheral wall portion extending from the peripheral edge in such a manner that the peripheral wall portion and the base wall portion cooperatively form a structure having a generally U-shaped cross-section, the non-patterned active metal layer formed on the housing wall extending from the base wall portion to the peripheral wall portion.

15. The method of claim 10, wherein formation of the non-patterned active metal layer is performed by immersing the housing wall into an aqueous active metal solution bath, followed by removing the housing wall from the aqueous active metal solution.

16. The method of claim 10, wherein the forming of the non-patterned active metal layer is performed by printing.

17. A method for making a capacitive touch sensitive housing, comprising:

forming a non-patterned active metal layer on a housing wall;

forming a metal layer on the non-patterned active metal layer; and patterning the metal layer and the non-patterned active metal layer such that the non-patterned active metal layer is formed into a patterned active metal layer which includes a plurality of plating portions physically separated from each other and a plurality of non-plating portions physically separated from the plating portions, and the metal layer has first portions formed on the plating portions of the patterned active metal layer and second portions formed on the non-plating portions of the patterned active metal layer.

18. The method of claim 17, wherein the forming of the non-patterned active metal layer is performed by printing.

19. A method for making a capacitive touch sensitive housing, comprising:

forming a patterned active metal layer on a housing wall such that the patterned active metal layer includes a plurality of plating portions physically separated from each other; and forming a metal layer on the patterned active metal layer such that the metal layer has s first portions formed on the plating portions of the patterned active metal layer.

20. The method of claim 19, wherein the forming of the patterned active metal layer is performed by printing.

* * * * *